US009182614B2

(12) United States Patent
Cho et al.

(10) Patent No.: US 9,182,614 B2
(45) Date of Patent: Nov. 10, 2015

(54) LARGE-AREA TRANSMISSIVE TYPE OPTICAL IMAGE MODULATOR AND METHOD OF MANUFACTURING THE SAME AND OPTICAL APPARATUS INCLUDING TRANSMISSIVE TYPE OPTICAL IMAGE MODULATOR

(71) Applicant: SAMSUNG ELECTRONICS CO., LTD., Suwon-si (KR)

(72) Inventors: Yong-chul Cho, Suwon-si (KR); Sang-hun Lee, Seoul (KR); Yong-hwa Park, Yongin-si (KR); Chang-young Park, Yongin-si (KR); Jong-oh Kwon, Suwon-si (KR); Jang-woo You, Yongin-si (KR); Hee-sun Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 333 days.

(21) Appl. No.: 13/725,010

(22) Filed: Dec. 21, 2012

(65) Prior Publication Data

US 2013/0270418 A1    Oct. 17, 2013

(30) Foreign Application Priority Data

Apr. 12, 2012 (KR) .......................... 10-2012-0038171

(51) Int. Cl.
*G02F 1/00* (2006.01)
*H01L 31/18* (2006.01)
(Continued)

(52) U.S. Cl.
CPC .. *G02F 1/00* (2013.01); *G01C 3/08* (2013.01); *G02F 1/015* (2013.01); *H01L 31/18* (2013.01); *G02F 2001/0157* (2013.01); *G02F 2203/12* (2013.01)

(58) Field of Classification Search
CPC .... C12Q 1/686; C12Q 1/6883; C12Q 1/6886; C12Q 2600/156; C12Q 2600/16; G01C 3/08; G02F 1/00; G02F 1/015; G02F 2001/0157; G02F 2203/12; G02F 19/20; H01L 31/18

USPC .................. 359/245, 248–250, 344
See application file for complete search history.

(56) References Cited

U.S. PATENT DOCUMENTS 5,093,875 A * 3/1992 Ogura et al. ................... 385/17
5,395,792 A * 3/1995 Ikawa et al. ................... 438/43
(Continued)

FOREIGN PATENT DOCUMENTS

JP       5-289123 A    11/1993
JP    2002-204039 A     7/2002
(Continued)

OTHER PUBLICATIONS

Ton van Niftrik, "The epitaxial lift-off method: III/V materials and HF etch process studies", Jan. 23, 2008, 155 pages.
(Continued)

*Primary Examiner* — Scott J Sugarman
*Assistant Examiner* — Vipin Patel
(74) *Attorney, Agent, or Firm* — Sughrue Mion, PLLC

(57) ABSTRACT

A large-area transmissive type optical image modulator, a method of manufacturing the same, and an optical apparatus including the transmissive type optical image modulator are provided. The large-area transmissive type optical image modulator includes: a base substrate; a first expitaxial layer formed on the base substrate; a second expitaxial layer formed on the first expitaxial layer; a first electrode formed on the first expitaxial layer and spaced apart from the second expitaxial layer; a second electrode formed on the second expitaxial layer; and a transparent substrate covering the second expitaxial layer and the second electrode, wherein the base substrate includes a through hole corresponding to a light emitting area, and the first expitaxial layer may include an n-type or p-type doping material.

22 Claims, 15 Drawing Sheets

(51) Int. Cl.
*G01C 3/08* (2006.01)
*G02F 1/015* (2006.01)

(56) References Cited

U.S. PATENT DOCUMENTS

| | | | |
|---|---|---|---|
| 6,331,911 B1 | 12/2001 | Manassen et al. | |
| 6,803,604 B2 * | 10/2004 | Takahashi et al. | 257/80 |
| 7,679,805 B2 | 3/2010 | Dadkhah et al. | |
| 7,719,746 B2 | 5/2010 | Goetz et al. | |
| 7,852,543 B2 | 12/2010 | Goetz et al. | |
| 2006/0132884 A1 * | 6/2006 | Kwon et al. | 359/248 |
| 2007/0053628 A1 * | 3/2007 | Park et al. | 385/14 |
| 2007/0177372 A1 * | 8/2007 | Matsuda et al. | 362/97 |
| 2010/0321755 A1 * | 12/2010 | Cho et al. | 359/248 |
| 2011/0181936 A1 * | 7/2011 | Cho et al. | 359/260 |
| 2012/0140309 A1 | 6/2012 | Cho et al. | |

FOREIGN PATENT DOCUMENTS

| | | |
|---|---|---|
| JP | 2003-202529 A | 7/2003 |
| KR | 10-2011-0086364 A | 7/2011 |
| KR | 10-1064046 B1 | 9/2011 |
| KR | 10-1140329 B1 | 5/2012 |
| KR | 10-2012-0061379 A | 6/2012 |
| KR | 10-2013-0033111 A | 4/2013 |

OTHER PUBLICATIONS

Chih-Hsiang Lin et al., "Normally on GaAs/AlAs multiple-quantum well Fabry-Perot transmission modulator with ON/OFF contrast ratios >7.4", Appl. Phys. Lett., American Institute of Physics, Mar. 6, 1995, pp. 1222-1224, vol. 66, No. 10.

Stephane Junique et al., "Multiple quantum well spatial light modulators Design—Fabrication—Characterization", Spatial Light Modulators: Technology and Applications, 2001, pp. 62-71, vol. 4457, Sweden.

T. H. Wood et al., "High-speed optical modulation with GaAs/GaAlAs quantum wells in a p-i-n. diode structure", Appl. Phys. Lett., American Institute of Physics, Jan. 1, 1984, pp. 16-18, vol. 44 (1).

Eli Yablonovitch et al., "Extreme selectivity in the lift-off of epitaxial GaAs films", Appl. Phys. Lett., American Institute of Physics, Dec. 28, 1987, pp. 2222-2224, vol. 51 (26).

C. Lethien et al., "850 nm Transmission Type ElectoAbsorption Modulator on SiO2 substrate", Electrochemical Society Proceedings, 2004, 4 pages, vol. 2004-02.

Goetz, et al.; "High-Performance Chirped Electrode Design for Cat's Eye Retro-Reflector Modulators", IEEE Photonics Technology Letters, Nov. 1, 2006, vol. 18, No. 21, 3 pages total.

* cited by examiner (a)

(b)

(a)

(b)

(a)

(b)

LARGE-AREA TRANSMISSIVE TYPE OPTICAL IMAGE MODULATOR AND METHOD OF MANUFACTURING THE SAME AND OPTICAL APPARATUS INCLUDING TRANSMISSIVE TYPE OPTICAL IMAGE MODULATOR

CROSS-REFERENCE TO RELATED APPLICATION

This application claims priority from Korean Patent Application No. 10-2012-0038171, filed on Apr. 12, 2012, in the Korean Intellectual Property Office, the disclosure of which is incorporated herein in its entirety by reference.

BACKGROUND

1. Field

Apparatuses and methods consistent with exemplary embodiments relate to an optical device, and more particularly, to a large-area transmissive type optical image modulator and a method of manufacturing the same, and an optical apparatus including the transmissive type optical image modulator.

2. Description of the Related Art

In order to obtain information regarding a range image, a stereo vision method using two cameras and a triangulation method using structured light and a camera are used.

However, when these methods are used, as the distance between the camera and the object is increased, precision may rapidly decrease. Also, these methods are dependent on a surface state of an object, and thus it may be difficult to obtain a minute range image.

In order to solve the above-described problem, a time-of-flight (TOF) method has been introduced. The TOF method is used to measure flight time in which separate modulated light, for example, a laser or light emitted from a light-emitting diode (LED), is radiated onto an object and then is returned to a light-receiving unit (a sensor or charged-coupled device (CCD) camera).

One TOF method is classified as a direct time measuring method of projecting pulse light and measuring time in which the pulse light is returned and a correlation method of measuring a distance from brightness information obtained by multiplying a gating signal synchronized with emitted light in a light receiving unit by a reflected light signal. A brightness image obtained by the correlation is bright at a short distance because of a large amount of light received and is dark at a long distance because of a small amount of light received.

Another TOF method includes a phase delay measuring method in which sine wave light or continuous wave (CW) light is projected and a phase difference of reflected light returning is sensed to determine a distance.

The phase delay measuring method is classified as an external modulation method or an internal modulation method.

In the external modulation method, a phase difference is measured by a CCD camera by projecting a sine wave that is frequency-modulated in an LED or a laser diode (LD) and modulating (mixing) an amplitude by a light modulator located at a front end of a light receiving unit to be converted into a low-frequency signal.

In the internal modulation method, a phase delay is measured by amplitude modulation or demodulation inside a CCD cell without an optical modulator. In order to perform modulation and demodulation inside a CCD cell, an additional function of processing signals around the CCD is required, and thus a fill factor deteriorates and a size of the CCD cell is increased, thereby imposing limitations in forming a high resolution distance camera.

A transmissive optical modulator includes an optical modulator using a Pockel effect or a Kerr effect based on an image intensifier or crystal optics. Such an optical modulator is bulky, uses a high voltage of several KV, and is expensive.

Another transmissive optical modulator includes a transmissive optical image shutter using GaAs-based electro-absorption. This transmissive optical modulator has a PIN diode structure in which an intrinsic layer between PN electrodes includes a multiple quantum well and forms excitons in a specific wavelength area to facilitate electro-absorption. If a bias voltage is applied to both ends of the PN electrode in a reverse direction, a maximum value of an absorption coefficient is decreased according to wavelengths and is red-shifted. If a peak of an absorption wavelength is in accordance with a Fabry-Perot wavelength, maximum optical absorption occurs, and brightness of light to be output may be controlled according to voltages. In such a transmissive optical modulator, an opaque GaAs substrate may be removed for light transmission.

After the GaAs substrate is removed, a remaining structure may be transferred to a transparent SiO2 substrate. However, a series of processes, in which a substrate of an expitaxial structure in which an electrode is formed during a process of manufacturing a wafer level is removed and transferred to another substrate, that is, an SiO2 substrate, may be complex, and thus it may be difficult to stably perform the processes.

Recently, although a transmissive optical modulator, in which a portion through which light passes is removed from a conventional opaque substrate and a transparent InGaP layer is added to an expitaxial layer to be used as a support for supporting an expitaxial structure, has been introduced, an expitaxial thin film may be vulnerable to an external impact or a mechanical transformation.

SUMMARY

One or more exemplary embodiments may provide an optical image modulator that may secure high-speed driving and uniformity of an electrical-optical response even in a large area, and has an enhanced tolerance to a mechanical transformation or an impact.

One or more exemplary embodiments may provide a method of manufacturing an optical image modulator.

One or more exemplary embodiments may provide an optical apparatus including a transmissive type optical image modulator.

Additional aspects will be set forth in part in the description which follows and, in part, will be apparent from the description, or may be learned by practice of the presented exemplary embodiments.

According to an aspect of an exemplary embodiment, a transmissive type optical image modulator includes a base substrate; a first expitaxial layer formed on the base substrate; a second expitaxial layer formed on the first expitaxial layer; a first electrode formed on the first expitaxial layer and spaced apart from the second expitaxial layer; a second electrode formed on the second expitaxial layer; and a transparent substrate covering the second expitaxial layer and the second electrode, wherein the base substrate includes a through hole corresponding to a light emitting area.

The first expitaxial layer may be an etch stop layer with respect to dry and wet etching. The first expitaxial layer may include an n-type or p-type doping material.

The second expitaxial layer may include a plurality of separated regions forming an array, and a second electrode is formed on each of the separated regions. The second expitaxial layer may include a lower distributed Bragg reflector (DBR) layer, an active layer, an upper DBR layer, and a contact layer that are sequentially stacked.

A transparent insulating layer covering the second expitaxial layer and a part of the second electrode may be disposed, and the transparent substrate may be disposed on the insulating layer.

The transmissive type optical image modulator may further include an adherent layer between the insulating layer and the transparent substrate.

One of the first and second electrodes may be an n-type electrode, and the other may be a p-type electrode.

The second electrode may have a fish bone shape, a mesh shape, or a grid shape.

The first electrode may have the same height as the second electrode. The transmissive type optical image modulator may further include an insulating layer between the first electrode and the first expitaxial layer.

The contact layer may be a compound semiconductor layer doped with an n-type or p-type doping material.

The transparent substrate may be transparent with respect to incident light having a wavelength of 850 nm.

The glass substrate may be coated with a light reflection barrier layer.

The divided layers forming the array may be disposed to be vertically and bilaterally symmetrical to one another.

The base substrate may be mounted on a printed circuit board (PCB), the PCB may include a plurality of driving devices, each driving device connected one of a plurality of the second electrode, the first electrode may be grounded through the PCB, and the PCB may include a through hole corresponding to the through hole of the base substrate.

The base substrate and the PCB may be bonded to each other using a metal paste.

The transparent substrate may electrically contact a PCB, the PCB may include a plurality of driving devices, each driving device connected to one of a plurality of the second electrode, the first electrode may be grounded through the PCB, and the PCB may include a through hole corresponding to the through hole in the base substrate.

A grounded first wiring line and a second wiring line connected to the driving device may be disposed on a bottom surface of the glass substrate, and the first and second wiring lines and the first and second electrodes may be flip-chip bonded to each other.

According to an aspect of another exemplary embodiment, an optical apparatus may be used to measure a distance and includes a light source, a light source driver, a lens, an optical modulator, an optical modulator driver, an IR band filter, and an image sensor, wherein the optical modulator is the optical modulator.

According to aspect of another exemplary embodiment, a method of manufacturing a transmissive type optical image modulator, the method includes: sequentially forming first and second expitaxial layers on a base substrate; exposing a part of the first expitaxial layer; forming a first electrode on an exposed area of the first expitaxial layer; forming a second electrode on the second expitaxial layer; forming a transparent substrate covering the second expitaxial layer and the second electrode; and forming a through hole for emitting light in the base substrate.

The exposing of the part of the first expitaxial layer may further include dividing the second expitaxial layer into a plurality of second expitaxial regions.

The dividing of the second expitaxial layer into a plurality of second expitaxial regions may further include dividing the second expitaxial layer so that the divided second expitaxial regions form an array in which the second expitaxial regions are disposed to be vertically and/or bilaterally symmetrical to one another.

The forming of the transparent substrate may further include: forming a transparent insulating layer covering the second electrode and the second expitaxial layer; forming a transparent adherent layer on the insulating layer; and attaching the transparent substrate onto the adherent layer.

The forming of the second expitaxial layer may further include sequentially growing a lower distributed Bragg reflector (DBR) layer, an active layer, an upper DBR layer, and a contact layer on the first expitaxial layer.

One of the first and second electrodes may be an n-type electrode, and the other may be a p-type electrode.

The first electrode may be disposed to surround a least one side of a part of the second expitaxial layer and to surround at least one side of the entire second expitaxial layer.

The first electrode may have the same height as the second electrode.

The method may further include an insulating layer between the first electrode and the first expitaxial layer.

The contact layer may be a compound semiconductor layer doped with an n-type or p-type doping material.

A reflection barrier layer may be coated on the transparent substrate.

The forming of a through hole in the base substrate may further include: sealing a stacked structure on the base substrate; defining a part where the through hole of the base substrate is to be formed; and performing wet etching on the defined part of the base substrate.

The method may further include mounting the base substrate on a printed circuit board (PCB), the PCB including to through hole and a plurality of driving devices disposed on the PCB; and connecting each of the driving devices to one of a plurality of the second electrode, wherein the first electrode may be grounded through the PCB.

The base substrate and the PCB may be bonded to each other using as metal paste.

The method may further include preparing a PCB, the PCB including the through hole and the plurality of driving devices; mounting the transparent substrate around the through hole of the PCB so that the through hole of the base substrate corresponds to the through hole of the PCB; and connecting each of the plurality of driving devices to one of the plurality of second electrodes, wherein the first electrode may be grounded through the PCB.

The mounting of the transparent substrate may further include: forming a wiring line connected to the driving device and a wiring line for grounding the first electrode on a bottom surface of the glass substrate; and flip-chip bonding the wiring lines and the first and second electrodes to each other.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
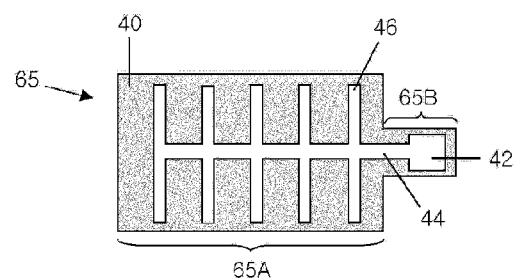
FIG. 1 is a plan view of an optical image modulator according to an exemplary embodiment.
Figure 1:
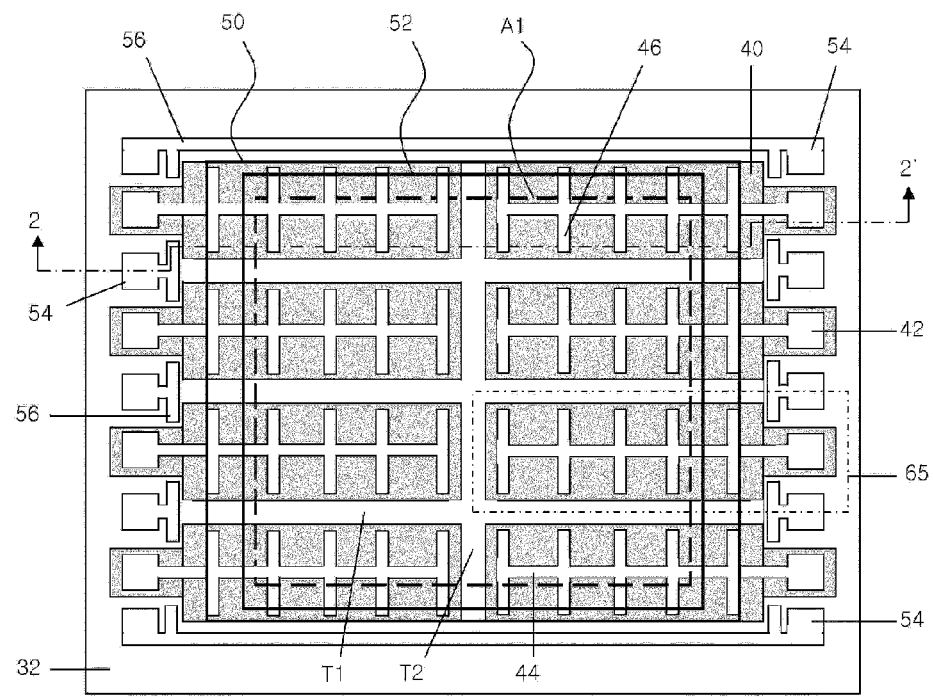

Hereinafter, exemplary embodiments will be described in detail with reference to the attached drawings. In the drawings, the thicknesses of layers and regions may be exaggerated for clarity. Expressions such as "at least one of," when preceding a list of elements, modify the entire list of elements and do not modify the individual elements of the list.

First, a transmissive type optical image modulator according to an exemplary embodiment will be described.

FIG. 1 is a plan view of an optical image modulator according to an exemplary embodiment.

Figure 2:
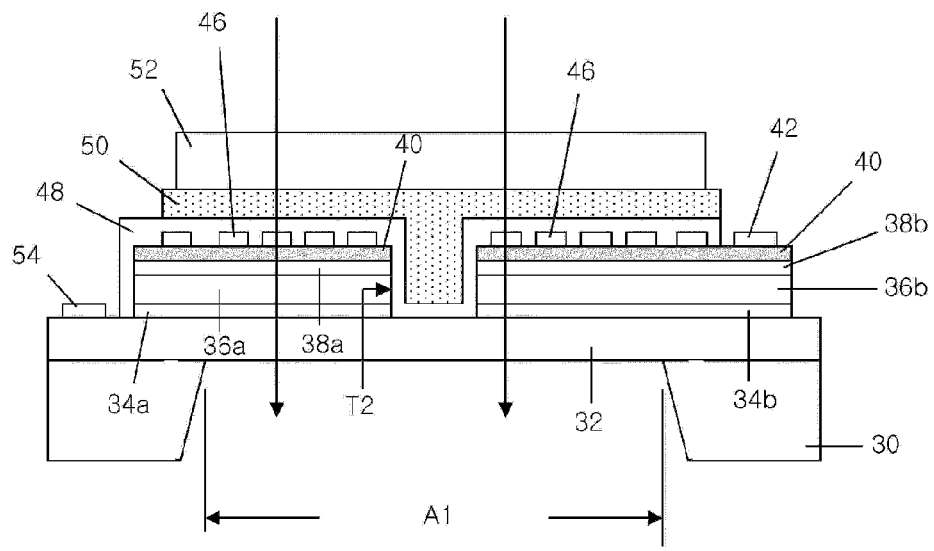
FIG. 2 is a cross-sectional view taken along a line 2-2' of FIG. 1.

Referring to FIG. 1, the large-area optical image modulator includes a plurality of unit optical modulators 65 forming an array. The unit optical modulators 65 may be unit modulation areas. The unit optical modulators 65 are disposed to be vertically and bilaterally symmetrical to one another. The unit optical modulators 65 are spaced apart from one another. First and second trenches T1 and T2 are formed between the unit optical modulators 65. As shown in FIG. 2, bottoms of the first and second trenches T1 and T2 are a top surface of a first expitaxial layer 32. A width of the first or second trench T1 or T2, that is, an interval between the unit optical modulators 65, may be a range, for example, between 10 μm and 30 μm or between 10 μm and 15 μm. The first expitaxial layer 32 may be used as a contact layer of a first electrode or a supporting layer of material layers stacked on the contact layer. Also, the first expitaxial layer 32 may be used as an etch stop layer during dry or wet etching. The first expitaxial layer 32 may be a transparent layer with respect to light having a specific wavelength, for example, a wavelength of 850 nm. The first expitaxial layer 32 may be doped to decrease a contact resistance between a first electrode 56 and a first electrode pad 54. When the first electrode 56 and the first electrode pad 54 are N-type electrodes, the first expitaxial layer 32 may be doped with silicon (Si), and a doping concentration may be equal to or greater than $8\times10E18/cm^3$. The first expitaxial layer 32 may be, for example, an InGaP layer. The InGaP layer has a similar lattice constant to GaAs, and thus may be formed by using an epitaxial growth method. As shown in FIG. 1, the unit optical modulators 65 may each include a body 65A, which light penetrates, and a protruding portion 65B that externally protrudes from the body 65A. Each of the unit optical modulators 65 includes second electrodes 44 and 46 and a second electrode pad 42 connected to the second electrodes 44 and 46 on an electrode contact layer 40. The second electrodes 44 and 46 have a fish bone shape in which a plurality of vertical components 46 are connected to one vertical component 44. An interval between the vertical components 46 may have a fixed size. At this time, widths of the vertical component 44 and the vertical components 46 may be formed as small as possible to improve a fill factor of the unit optical modulator 65, and the width may be, for example, equal to or less than 10 μm. Also, a pitch between the vertical components 46 may be maintained as wide as possible to improve the fill factor of the unit optical modulator 65 and the pitch may be, for example, equal to or greater than 250 μm. In this case, the fill factor of the unit optical modulator 65 is equal to or greater than 95%. The first electrode 56 and the first electrode pad 54 are located between protruding portions 65B of the unit optical modulators 65. Thus, two first electrodes 56 and two first electrode pads 54 correspond to one unit optical modulator 65. That is, the first electrode 56 and the first electrode pad 54 are common electrodes with respect to two adjacent unit optical modulators 65.

Reference numeral 50 of FIG. 1 denotes an adherent layer and may be an epoxy layer. The first electrode pad 54 and the second electrode pad 42 are disposed outside of the adherent layer 50 to avoid process interference when forming the epoxy layer. Reference numeral 52 denotes a substrate which is transparent with respect to incident light. The transparent substrate 52 is adhered to the unit optical modulators 65 by the adherent layer 50. The transparent substrate 52 may be, for example, a glass substrate, or may be a substrate formed of any of a number of other transparent materials other than glass. Reference numeral A1 denotes an entire light transmission area of the unit optical modulators 65 through which incident light passes. The light transmission area A1 corresponds to an area from which a part of a base substrate 30 is removed as shown in FIG. 2. A boundary of the light transmission area A1 is located at an innermost position of an end of the transparent substrate 52.

FIG. 2 is a cross-sectional view taken along a line 2-2' of FIG. 1.

Referring to FIG. 2, the first expitaxial layer 32 is formed on the base substrate 30 having the light transmission area A1. The first expitaxial layer 32 covers the light transmission area A1 of the base substrate 30. The base substrate 30 may be, for example, a GaAs layer. An optical thickness of the first expitaxial layer 32 may be a multiple of 0.5λ to prevent a loss of incident light or a variation in a phase from being generated, and the optical thickness of the first expitaxial layer 32 may be, for example, 4λ. In this regard, λ denotes a wavelength of light incident to the first expitaxial layer 32, for example, 850 nm. Under such conditions, a real thickness of the first expitaxial layer 32 may be determined. The first expitaxial layer 32 may be grown up to, for example, 2 μm. The first expitaxial layer 32 may be an n-type or p-type contact layer. When the first expitaxial layer 32 is a p-type contact layer, the first expitaxial layer 32 may be doped with a p-type doping material, for example, Be. At this time, a doping concentration of Be may be $1\times10E19/cm^3$. First and second lower distributed Bragg reflector (DBR) layers 34a and 34b that are spaced apart from each other are disposed on the first expitaxial layer 32. A distance between the first and second lower DBR layers 34a and 34b corresponds to a width of the second trench T2.

The first lower DBR layer 34a includes a plurality of pairs of layers that are sequentially stacked. In this regard, each pair includes two layers that have different refractive indexes and are sequentially stacked. A first layer of each pair may be, for example, an Al0.31Ga0.69As layer, and a second layer formed on the first layer may have a refractive index lower than that of the first layer and may be, for example, an Al0.88Ga0.12As layer. The first and second layers may have an optical thickness of λ/4. In this regard, λ denotes a wavelength of light incident to the first lower DBR layer 34a. The first lower DBR layer 34a may be an n-type or p-type DBR layer according to types of the first electrode pad 54 and the first electrode 56, and the first lower DBR layer 34a may include, for example, 4 pairs of layers. A first active layer 36a and a first upper DBR layer 38a may be sequentially stacked on the first lower DBR layer 34a. The first active layer 36a has a multiple quantum well (MQW) structure. The first active layer 36a is a layer in which photoelectric absorption occurs and may include an undoped intrinsic compound semiconductor layer. The compound semiconductor layer may include a plurality of pairs of layers. At this time, each pair may include a compound semiconductor layer having a quantum well and a compound semiconductor layer serving as a barrier. The compound semiconductor layer having a quantum well may be, for example, a GaAs layer. The compound semiconductor layer serving as a barrier may be, for example, an Al0.31Ga0.69As layer having an energy bandgap. The compound semiconductor layer having a quantum well and the compound semiconductor layer serving as a barrier form a cavity. Light incident to the first active layer 36a may be absorbed into the first active layer 36a while resonating between the first lower DBR layer 34a and the first upper DBR layer 38a. An entire optical thickness of the cavity may be an integer multiple of λ/2, for example, 5λ. In this regard, λ denotes a wavelength of incident light. Reflexibilities of the first lower DBR layer 34a and the first upper DBR layer 38a may be determined so that light absorption reaches a maximum in the first active layer 36a. When a voltage is not applied, an absorption wavelength of the first active layer 36a may be lower than that of incident light by about 10 nm to 15 nm. If a voltage is applied, the absorption wavelength of the first active layer 36a is changed to a long wavelength (red shift). When the applied voltage is a reverse voltage, the absorption wavelength of the first active layer 36a may be equal to a wavelength of incident light. As such, an absorption wavelength of the first active layer 36a may vary according to whether a voltage is applied or not, and thus a light transmittance of the first active layer 36a varies with respect to incident light of a given wavelength. The first upper DBR layer 38a may have the same configuration as the first lower DBR layer 34a. However, a number of pairs of layers included the first upper DBR layer 38a may be the same as or different from a number of pairs of layers included in the first lower DBR layer 34a. The first upper DBR layer 38a may be a p-type or n-type DBR layer according to a type of the second electrode 46. The contact layer 40 is disposed on the first upper DBR layer 38a. The contact layer 40 may be a p-type or n-type contact layer according to a type of the second electrode 46. For example, if the second electrode 46 is a p-type electrode, the contact layer 40 may be a p-type contact layer. If the second electrode 46 is an n-type electrode, the contact layer 40 may be an n-type contact layer. The contact layer 40 may be, for example, a GaAs layer. A plurality of the second electrodes 46 are formed on the contact layer 40. The second electrodes 46 may be p-type or n-type electrodes. As described above, types of the contact layer 40 and the first upper DBR layer 38a are determined according to a type of the second electrode 46. The contact layer 40 and the second electrodes 46 are covered by an insulating layer 48. Also, side surfaces of the first lower DBR layer 34a, the first active layer 36a, and the first upper DBR layer 38a are covered by the insulating layer 48. A bottom of the second trench T2, that is, a top surface of the first expitaxial layer 32 between the first and second lower DBR layers 34a and 34b, is covered by the insulating layer 48. The insulating layer 48 may be, for example, a silicon oxide layer or a silicon nitride layer. One side surface of a stacked structure including the first lower DBR layer 34a, the first active layer 36a, the first upper DBR layer 38a, and the contact layer 40 forms a first side wall of the second trench T2. The first electrode pad 54 is disposed on the first expitaxial layer 32. The first electrode pad 54 is spaced apart from the first expitaxial layer 32. The first electrode pad 54 may be an n-type or p-type electrode pad. Types of the first expitaxial layer 32 and the first lower DBR layer 34a are determined according to a type of the first electrode pad 54.

When the second electrode pad 42 and the second electrodes 46 are p-type electrodes and when the first electrode pad 54 and the first electrode 56 are n-type electrodes, the unit optical modulator 65 may be a PIN-type diode. When the second electrode pad 42 and the second electrodes 46 are n-type electrodes and when the first electrode pad 54 and the first electrode 56 are p-type electrodes, the unit optical modulator 65 may be an NIP-type diode.

The first electrode pad 54 may have a single-layered structure or a multi-layered structure. If the first electrode pad 54 has a multi-layered structure and is an n-type electrode pad, the first electrode pad 54 may have a structure in which an Ni layer, an Au layer, a Ge layer, an Ni layer, and an Au layer are sequentially stacked. Alternatively, if the first electrode pad 54 has a multi-layered structure and is a p-type electrode pad, the first electrode pad 54 may have a structure in which a Pt layer, a Ti layer, a Pt layer, and an Au layer are sequentially stacked. The first electrode 56 is formed of the same material as the first electrode pad 54 and is formed at the same time as when the first electrode pad 54 is formed, and thus a configuration of the first electrode 56 may be the same as that of the first electrode pad 54. The second active layer 36b, the second upper DBR layer 38b, and the contact layer 40 are sequentially formed on the second lower DBR layers 34b that are adjacent to each other by interposing the second trench T2. A configuration of the second lower DBR layer 34b may be the same as that of the first lower DBR layer 34a. A configuration of the second active layer 36b may be the same as that of the first active layer 36a. A configuration of the second upper DBR layer 38b may be the same as that of the first upper DBR layer 38a. The second electrodes 46 and the second electrode pad 42 are formed on the contact layer 40 formed on the second upper DBR layer 38b. The second electrode 46 and the second electrode pad 42 may have a single-layered structure or a multi-layered structure. If the second electrode 46 and the second electrode pad 42 have a multi-layered structure, a case in which the second electrodes 46 and the second electrode pad 42 are p-type electrode pads may be different from a case in which the second electrodes 46 and the second electrode pad 42 are n-type electrode pads, and a configuration of the first electrode pad 54 may be applied. The second electrode pad 42 and the second electrodes 46 may be transparent conductors to improve a fill factor, and the second electrode pad 42 and the second electrodes 46 may be formed of, for example, indium tin oxide (ITO), zinc oxide (ZnO), or aluminum zinc oxide (AZO). The second electrodes 46 are covered by the insulating layer 48. A top surface around the second electrodes 46 is covered by the insulating layer 48. Side surfaces of the second lower DBR layer 34b, the second active layer 36b, the second upper DBR layer 38b, and the contact layer 40 forming a second side wall of the second trench T2 are covered by the insulating layer 48. The second side wall of the second trench T2 faces the first side wall. An adherent layer 50 is formed on the insulating layer 48 so as to fill the second trench T2. The adherent layer 50 may cover the second electrodes 46. The first and second electrode pads 54 and 42 are disposed outside of the adherent layer 50. The adherent layer 50 is used to attach the transparent substrate 52 formed on the adherent layer 50 to the insulating layer 48. The adherent layer 50 may be an optical epoxy layer which is transparent with respect to incident light. For example, the adherent layer 50 may be a transparent epoxy layer with respect to light having a wavelength band of 850 nm. A thickness of the adherent layer 50 may be, for example, in a range between about 5 μm and about 10 μm. The transparent substrate 52 is formed on the adherent layer 50. The transparent substrate 52 may be a supporting substrate for supporting the entire structure of an optical image modulator according to an exemplary embodiment. A thickness of the transparent substrate 52 may be, for example, in a range between about 200 μm and about 500 μm. Although not shown in FIG. 2, a reflection barrier layer may further be formed on the transparent substrate 52. The reflection barrier layer may be interposed between the transparent substrate 52 and the adherent layer 50. The reflection barrier layer may be a reflection barrier layer with respect to incident light having a wavelength band of 850 nm.

Meanwhile, even when the large-area optical image modulator of FIGS. 1 and 2 is a single optical modulator having a large area without being divided into the plurality of unit optical modulators 65, the adherent layer 50 and the transparent substrate 52 may be formed in the same manner.

Figure 3:
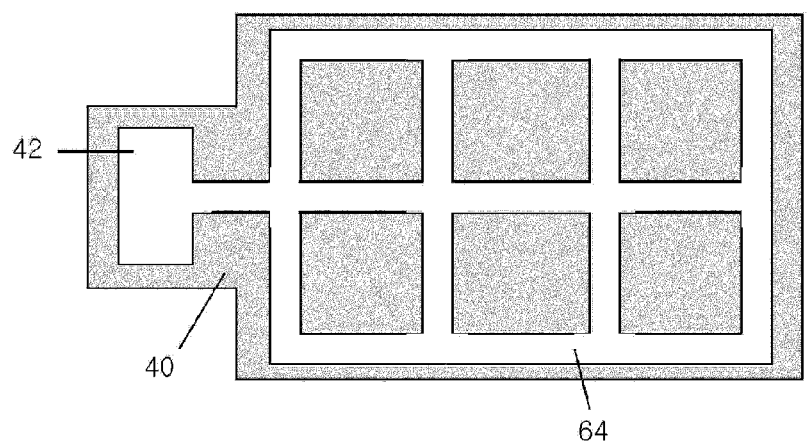
FIGS. 3 and 4 are plan views of a second electrode of a unit optical modulator of FIG. 1 according to other exemplary embodiments.
Figure 4:
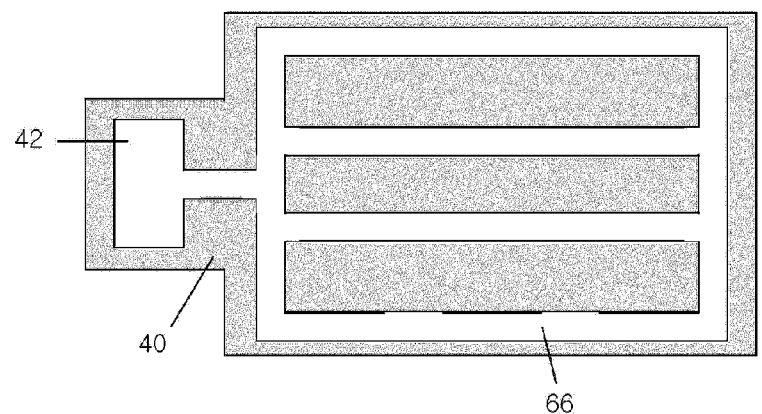

FIGS. 3 and 4 are plan views of a second electrode of the unit optical modulator 65 of FIG. 1 according to other exemplary embodiments.

Referring to FIG. 3, the second electrode pad 42 and the third electrode 64 having a mesh shape and connected to the second electrode pad 42 are formed on the adherent layer 40. In this regard, a width of the third electrode 64 may be the same as those of the second electrodes 44 and 46 of FIG. 1. The third electrode 64 may perform the same function as those of the second electrodes 44 and 46 of FIG. 1. In FIGS. 1 to 3, although electrodes formed on the adherent layer 40 are distinguished as the second electrode pad 42 and the second electrodes 44 and 46 or the third electrode 64, the second electrode pad 42 and the second electrodes 44 and 46 or the second electrode pad 42 and the third electrode 64 form one connected pattern, and thus together form an electrode.

Referring to FIG. 4, the second electrode pad 42 and a fourth electrode 66 having a grid shape and connected to the second electrode pad 42 are formed on the adherent layer 40. The fourth electrode 66 may perform the same function as those of the second electrodes 44 and 46 of FIG. 1. A width of a metal line forming the fourth electrode 66 may be the same as those of the second electrodes 44 and 46 of FIG. 1.

Figure 5:
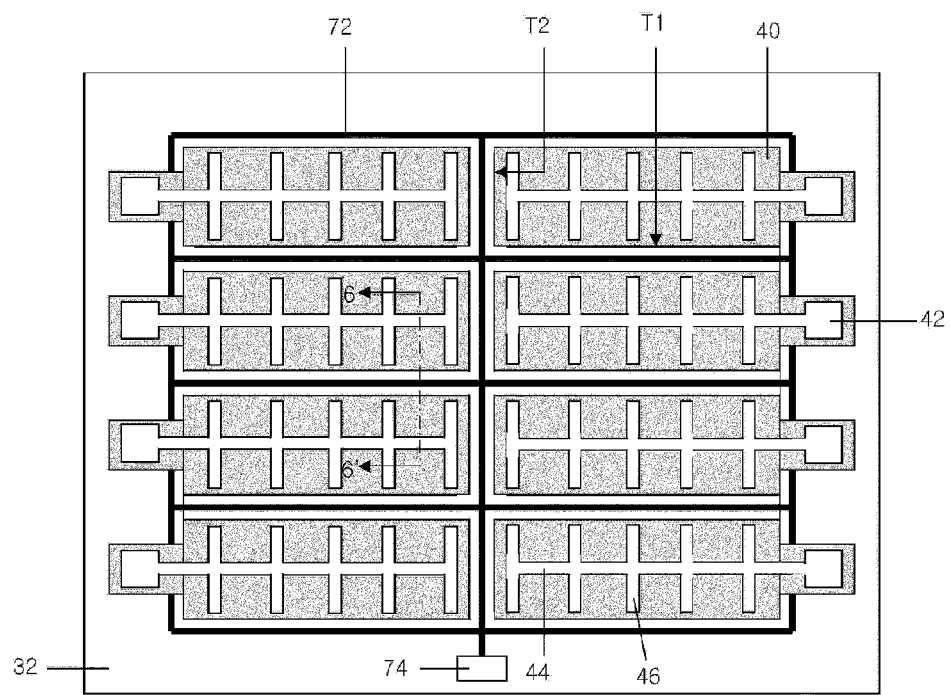
FIG. 5 is a plan view of a first electrode pad and a first electrode in an optical image modulator array of FIG. 1 according to another exemplary embodiment.

FIG. 5 is a plan view of the first electrode pad 54 and the first electrode 56 in the optical image modulator array of FIG. 1 according to another exemplary embodiment. For convenience of description, the adherent layer 50 and the transparent substrate 52 are omitted.

Referring to FIG. 5, one fifth electrode pad 74 and a fifth electrode 72 connected to the fifth electrode pad 74 are formed on the first expitaxial layer 32. Although the fifth electrode pad 74 and the fifth electrode 72 are respectively an n-type electrode pad and an n-type electrode, the fifth electrode pad 74 and the fifth electrode 72 may be respectively a p-type electrode pad and a p-type electrode. In other words, the fifth electrode pad 74 and the fifth electrode 72 may be used in the same manner as the first electrode pad 54 and the first electrode 56 of FIG. 1. The fifth electrode 72 is formed around an optical image modulator array and is also formed in first and second trenches T1 and T2. Thus, the fifth electrode 72 has a form surrounding each individual unit optical modulator. The fifth electrode 72 and the fifth electrode pad 74 are common electrodes with respect to a plurality of the unit optical modulators forming an array.

Figure 6:
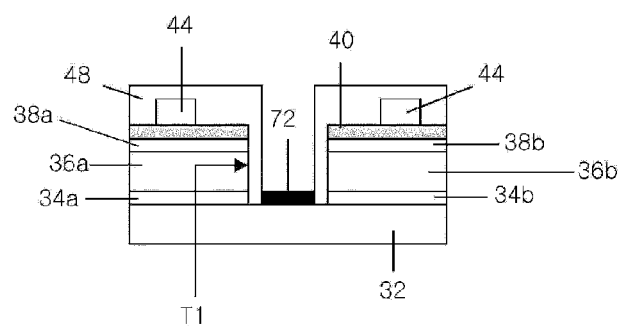
FIG. 6 is a cross-sectional view taken along a line 6-6' of FIG. 5.

FIG. 6 is a cross-sectional view taken along a line 6-6' of FIG. 5.

Referring to FIG. 6, the fifth electrode 72 is formed on a bottom surface of the first trench T1. Also, an insulating layer 48 is formed between material layers 34a, 34b, 36a, 36b, 38a, 38b, and 40 stacked on the first expitaxial layer 32 and the fifth electrode 72. Thus, the fifth electrode 72 does not electrically contact the material layers 34a, 34b, 36a, 36b, 38a, 38b, and 40 stacked on the first expitaxial layer 32.

Figure 7:
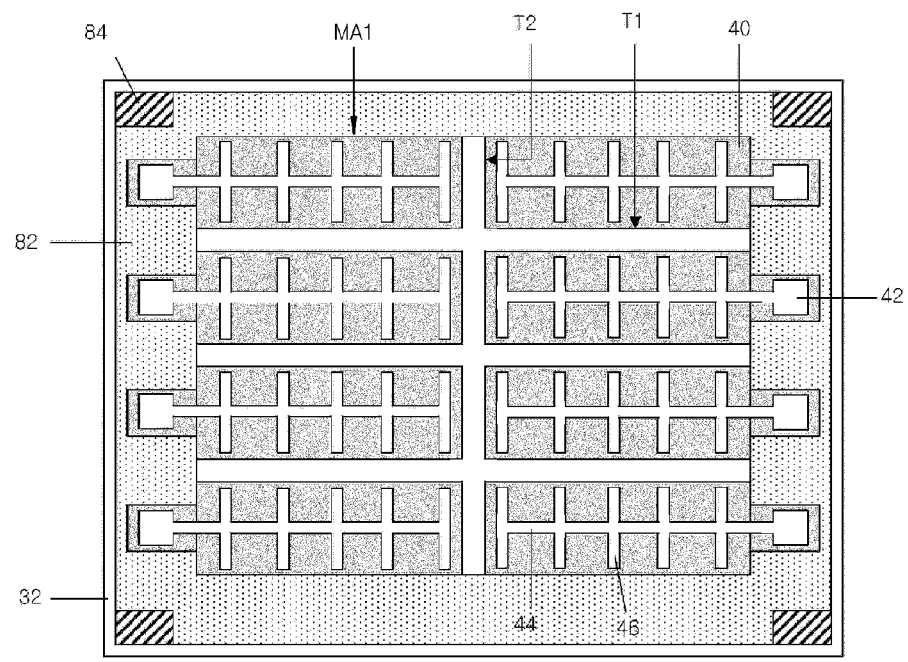
FIG. 7 is a plan view of a first electrode pad and a first electrode in the optical image modulator of FIG. 1 according to another exemplary embodiment.

FIG. 7 is a plan view of the first electrode pad 54 and the first electrode 56 in the optical image modulator of FIG. 1 according to another exemplary embodiment.

Referring to FIG. 7, a sixth electrode 82 and a plurality of sixth electrode pads 84 connected to the sixth electrode 82 are formed on the first expitaxial layer 32 around an optical image modulator array (MA1). The sixth electrode 82 may be formed to completely surround the optical image modulator array (MA1) and to cover most areas of the first expitaxial layer 32 around the optical image modulator array (MA1). The sixth electrode 82 is electrically insulated from material layers formed on the first expitaxial layer 32 like the fifth electrode 72 shown in FIG. 6. The sixth electrode pads 84 may be respectively formed at four corners of the first expitaxial layer 32.

Since the first electrode 56, the fifth electrode 72, and the sixth electrode 82 are formed as shown in FIGS. 1, 5, and 7, and the second electrode pad 42 and the third and fourth electrodes 64 and 66 are formed as shown in FIGS. 1, 3, and 4, a sheet resistance of the contact layer 40 may be decreased. Also, since a large-area optical image modulator is formed to be divided into a plurality of unit optical modulators, a capacitance may be decreased, and thus the large-area optical image modulator may be operated at high speeds, and also response uniformity may be improved.

Figure 8:
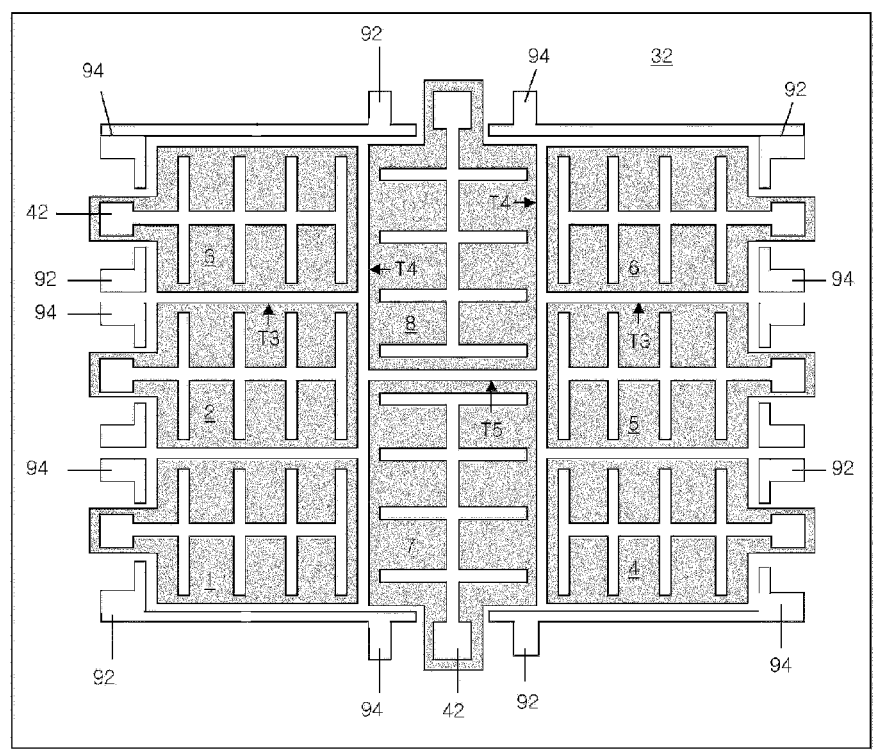
FIG. 8 is a plan view of a large-area optical image modulator according to another exemplary embodiment.

FIG. 8 is a plan view of a large-area optical image modulator according to another exemplary embodiment. For convenience of description, the adherent layer 50 and the transparent substrate 52 are omitted in FIG. 8.

A configuration of the optical image modulator shown in FIG. 8 may be the same as that of the optical image modulator shown in FIG. 1 except for the arrangement of a plurality of unit optical modulators forming an array. Also, the description regarding FIGS. 3 to 7 may be applied to FIG. 8.

Referring to FIG. 8, first to third unit optical modulators 1 to 3 form a first column, and fourth to sixth unit optical modulators 4 to 6 form a second column. A third trench T3 is formed between the first to sixth unit optical modulators 1 to 6. A width of the third trench T3 may be, for example, in a range between about 10 and about 30 μm. The first to third unit optical modulators 1 to 3 of the first column may be bilaterally symmetrical to the fourth to sixth unit optical modulators 4 to 6 of the second column. The seventh and eighth unit optical modulators 7 and 8 are formed between the first column and the second column and form a column. A configuration of each of the first to eighth unit optical modulators 1 to 8 may be the same as that of the unit optical modulator 65 of FIG. 1. The eighth unit optical modulator may have a shape whereby the third unit optical modulator 3 revolves clockwise at 90 degrees or the sixth unit optical modulator 6 revolves counterclockwise at 90 degrees. Configurations and shapes of the third unit optical modulator 3 and the eighth unit optical modulator 8 may be the same, but the entire sizes thereof may be different from each other. The seventh unit optical modulator 7 may have a shape whereby the first unit optical modulator 1 revolves counterclockwise at 90 degrees or the fourth unit optical modulator 4 revolves clockwise at 90 degrees. A fourth trench T4 is formed between the seventh and eighth unit optical modulators 7 and 8 that form one column and the first to sixth unit optical modulators 1 to 6. Also, a fifth trench T5 is formed between the seventh unit optical modulator 7 and the eighth unit optical modulator 8. Widths of the fourth and fifth trenches T4 and T5 may be the same as that of the third trench T3. Purposes and formation characteristics of the third to fifth trenches T3 to T5 may be the same as those of the second trench T2 of FIG. 2. By forming the first to eighth unit optical modulators 1 to 8 to be bilaterally symmetrical to one another, a distance between the second electrode pad 42 of each unit optical modulator and the second electrode 46 positioned farthest from the second electrode pad 42 may be decreased, and thus a response speed of the unit optical modulator may further be increased.

Two electrodes 92 and 94 correspond to the second electrode pad 42 of each unit optical modulator. The two electrodes 92 and 94 face each other around the second electrode pad 42. The two electrodes 92 and 94 perform the same functions as the first electrode pad 54 and the first electrode 56 of FIG. 1. The two electrodes 92 and 94 are a seventh electrode 92 and an eighth electrode 94, respectively. From among the two electrodes 92 and 94 corresponding to the second electrode pad 42 of the third unit optical modulator 3, the eighth electrode 94 is connected to the seventh electrode 92 from among the two electrodes 92 and 94 corresponding to the second electrode pad 42 of the eighth unit optical modulator 8. The eighth electrode 94 corresponding to the second electrode pad 42 of the eighth unit optical modulator 8 is connected to the seventh electrode 92 corresponding to the second electrode pad 42 of the sixth unit optical modulator 6. The seventh electrode 92 corresponding to the second electrode pad 42 of the first unit optical modulator 1 is connected to the eighth electrode 94 corresponding to the second electrode pad 42 of the seventh unit optical modulator 7. The seventh electrode 92 corresponding to the second electrode pad 42 of the seventh unit optical modulator 7 is connected to the eighth electrode 94 corresponding to the second electrode pad 42 of the fourth unit optical modulator 4.

Figure 9:
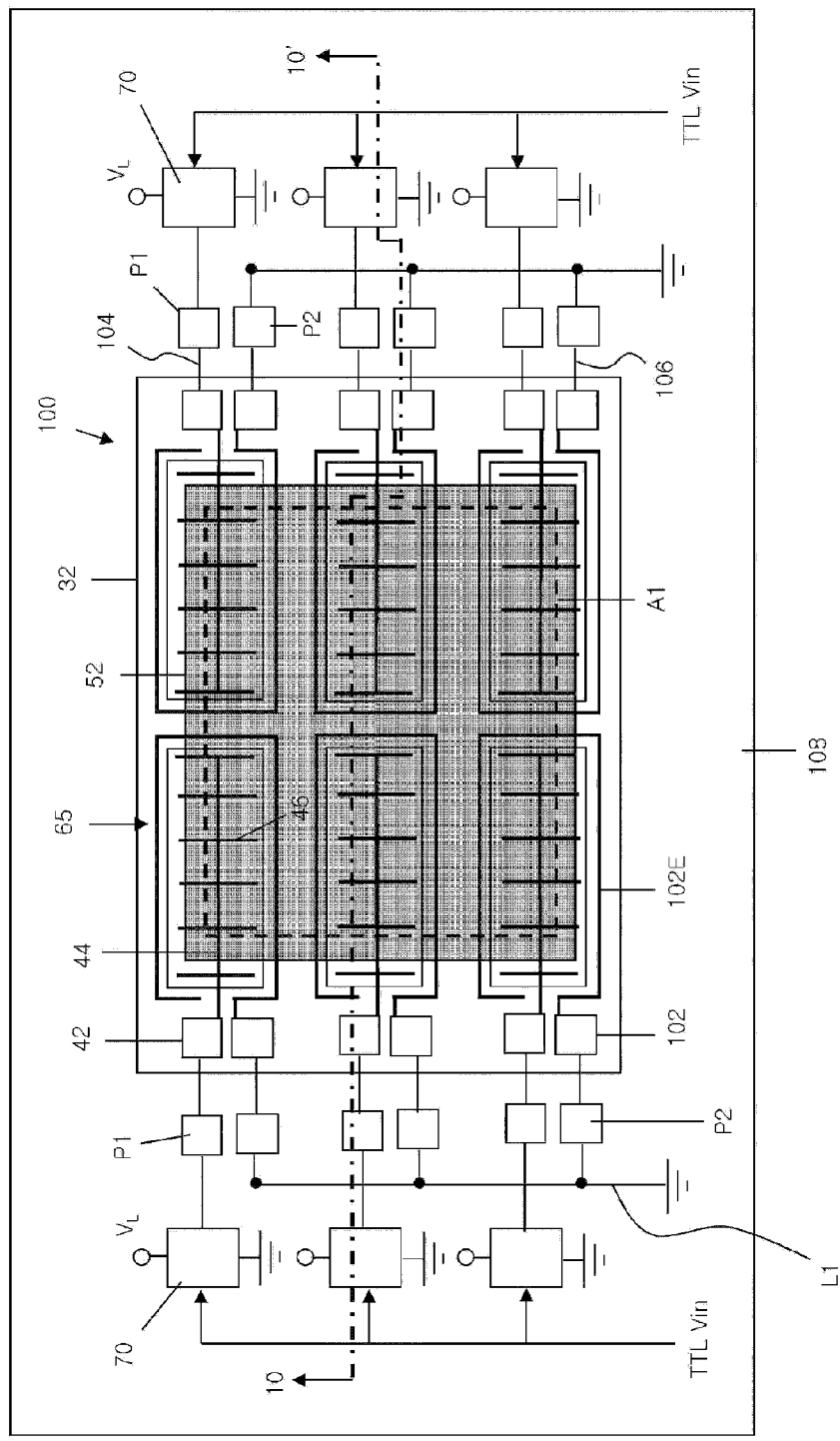
FIG. 9 is a plan view showing a connection between a large-area optical image modulator and a driving device of a printed circuit board (PCB) according to an exemplary embodiment.

FIG. 9 is a plan view showing a connection between a large-area optical image modulator 100 and a driving device 70 of a printed circuit board (PCB) according to an exemplary embodiment.

The entire area of the optical image modulator 100 shown in FIG. 9 is in a range between about 4 mm×3 mm and about 8 mm×6 mm. An area of each of a plurality of unit optical modulators 65 forming an array included in the optical image modulator 100 is, for example, about 3 mm×0.5 mm.

As such, since an area of each unit optical modulator 65 is small, a capacitance may be decreased, and the unit optical modulator 65 corresponds one-to one to the driving device 70. Accordingly, although the optical image modulator 100 of the current embodiment has a large area, the optical image modulator 100 may be operated at high speeds and may have increased response uniformity.

In FIG. 9, the unit optical modulator 65 includes a ninth electrode pad 102 making a pair with the second electrode pad 42. The ninth electrode pad 102 is connected to a ninth electrode 102E surrounding the second electrodes 44 and 46. The ninth electrode pad 102 and the ninth electrode 102E may perform the same functions as the first electrode pad 54 and the first electrode 56 of FIG. 1. In the unit optical modulator 65, the second electrode pad 42 and the second electrodes 44 and 46 may have shapes as shown in FIG. 3 or 4. The plurality of unit optical modulators 65 are arranged if two columns and Y rows. In this regard, Y may be equal to or greater than 1, and a number of rows (Y value) may be appropriately determined in consideration of the entire area of the large-area optical image modulator 100, an area of the unit optical modulator, a fill factor, and the like. Assuming that a circuit becomes complex and frequency response uniformity between the unit optical modulators 65 is slightly decreased, the plurality of unit optical modulators 65 may be arranged in two or more columns. For convenience of description, the adherent layer 50 is omitted in FIG. 9. The unit optical modulators 65 are arranged on the first expitaxial layer 32. The optical image modulator 100 is mounted on a PCB 108. The unit optical modulators 65 are located between the driving devices 70 formed on the PCB 108. When the unit optical modulators 65 are operated at frequencies of several tens of MHz, for example, at frequencies equal to or greater than 20 MHz, a current of several tens of mA may be generated. Accordingly, the driving devices 70 may control a relatively high current and may be a metal oxide semiconductor field effect transistor (MOSFET) in which a square wave may be generated. However, the driving devices 70 are not limited to MOSFETs. The driving devices 70 are arranged in two columns at both sides of the unit optical modulators 65, respectively, and a number of lines of each column is the same as a number of lines of the unit optical modulators 65. Consequently, the unit optical modulators 65 correspond one-to-one to the driving devices 70. A distance between each unit optical modulator 65 and each driving device 70 is regular and may be as short as possible. First and second bonding pads P1 and P2 are disposed between each unit optical modulator 65 and each driving device 70. The first and second bonding pads P1 and P2 are formed on the PCB 108. The first bonding pad P1 corresponds to the second electrode pad 42 of each unit optical modulator 65. The second bonding pad P2 corresponds to the ninth electrode pad 102 of each unit optical modulator 65. A distance between the first bonding pad P1 and the second electrode pad 42 may be the same as a distance between the second bonding pad P2 and the ninth electrode pad 102. The first bonding pad P1 is connected to the driving device 70. Thus, the driving device 70 is connected to the second electrode pad 42 via the first bonding pad P1. The ninth electrode pad 102 of each unit optical modulator 65 is commonly connected to a wiring line L1 that is grounded. The unit optical modulators 65 may be collectively operated under the control of a low transistor-transistor logic (TTL) level current voltage.

In FIG. 9, each unit optical modulator 65 corresponds one-to one to an independent driving device 70. Accordingly, each unit optical modulator 65 may be individually operated. Also, an electrical wiring line between each driving device 70 and its corresponding unit optical modulator 65 may be formed under the same conditions so that a difference in a phase delay between the unit optical modulators 65 may be minimized. As a result, the unit optical modulators 65 may be collectively operated under the same conditions, and thus the unit optical modulators 65 may be operated at high speeds in the same manner and may have a uniform frequency response characteristic. Accordingly, the large-area optical image modulator 100 may be operated at high speeds and may have a uniform frequency response characteristic according to the unit optical modulators 65.

Meanwhile, all wiring lines, such as signal lines or ground lines, on the PCB 108 are based on as designs of a micro-strip and a coupler that comply with a condition of 50Ω. Also, portions bent at right angles in the electrical wiring lines on the PCB 108 are rounded to minimize a radio frequency (RF) loss. If a multiple driving device with a plurality of MOSFETs is used, lengths of wiring lines between the driving devices 70 and the unit optical modulators 65 are different, and thus the multiple driving device may be tuned by adding a time delay element (for example, a concavo-convex element having a long electrical wiring line) for compensating for the different lengths of the wiring lines to the multiple driving device so as to provide the same electrical driving condition.

Also, like a case shown in FIG. 8, if the unit optical modulators are disposed to be vertically and bilaterally symmetrical to one another, MOSFET drivers may be disposed on the left, right, upper and lower sides to correspond one-to-one to the unit optical modulators. At this time, an electrode, for example, an N electrode, formed on the first expitaxial layer 32 is commonly configured with respect to the unit optical modulators so that application of a maximum reverse direction bias voltage VL of −5 V to −10 V may be turned on/off with respect to a TTL level input to the individual second electrode pad 42.

Figure 10:
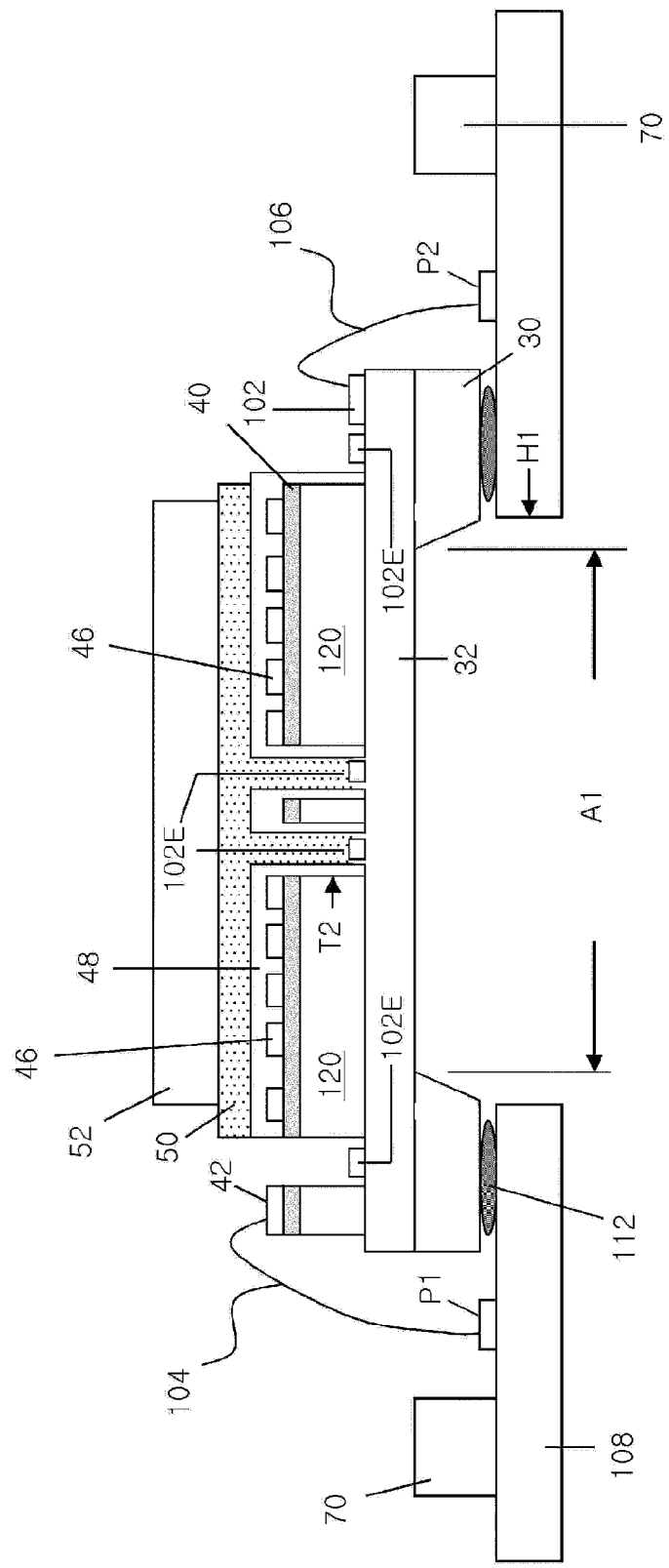
FIG. 10 is a cross-sectional view taken along a line 10-10' of FIG. 9.

FIG. 10 is a cross-sectional view taken along a line 10-10' of FIG. 9.

Referring to FIG. 10, the second electrode pad 42 and the first bonding pad P1 are connected to each other via a first wire 104. The ninth electrode pad 102 and the second bonding pad P2 are connected to each other via a second wire 106. The driving devices 70 are connected to the first and second bonding pads P1 and P2 via a wiring line (not shown) formed on the PCB 108. The PCB 108 has a through hole H1 in a position corresponding to an opened area A1 of the base substrate 30. A diameter of the through hole H1 may be larger than that of the opened area A1 of the base substrate 30. A boundary of the opened area A1 is located inside of the boundary of the through hole H1. The base substrate 30 adheres to a portion of the upper surface of the PCB 108 adjacent to the through hole H. The base substrate 30 and the PCB 108 adhere to each other via a metal paste 112. The metal paste 112 may be formed through a low-temperature process and may be a silver paste that may be formed at a temperature, for example, equal to or less than 200° C.

A process of attaching the optical image modulator 100 and the PCB 108 to each other by using the metal paste 112 may be performed by coating a non-solid metal paste on a predetermined portion of the PCB 108, attaching the optical image modulator 100 to the PCB 108 via the coated non-solid metal paste, and baking the optical image modulator 100 and the PCB 108 at a temperature of 150° C. for one hour. As a result, the optical image modulator 100 may be attached to the PCB 108 via the metal paste 112.

Next, the second trench T2 is formed between the unit optical modulators 65, a side wall of the second trench T2 is covered by the insulating layer 48, and the ninth electrode 102E is formed on a bottom surface of the second trench T2. Reference numeral 120 denotes a stacked structure that is epitaxially grown and includes a lower DBR layer, an active layer, and an upper DBR layer.

Figure 11:
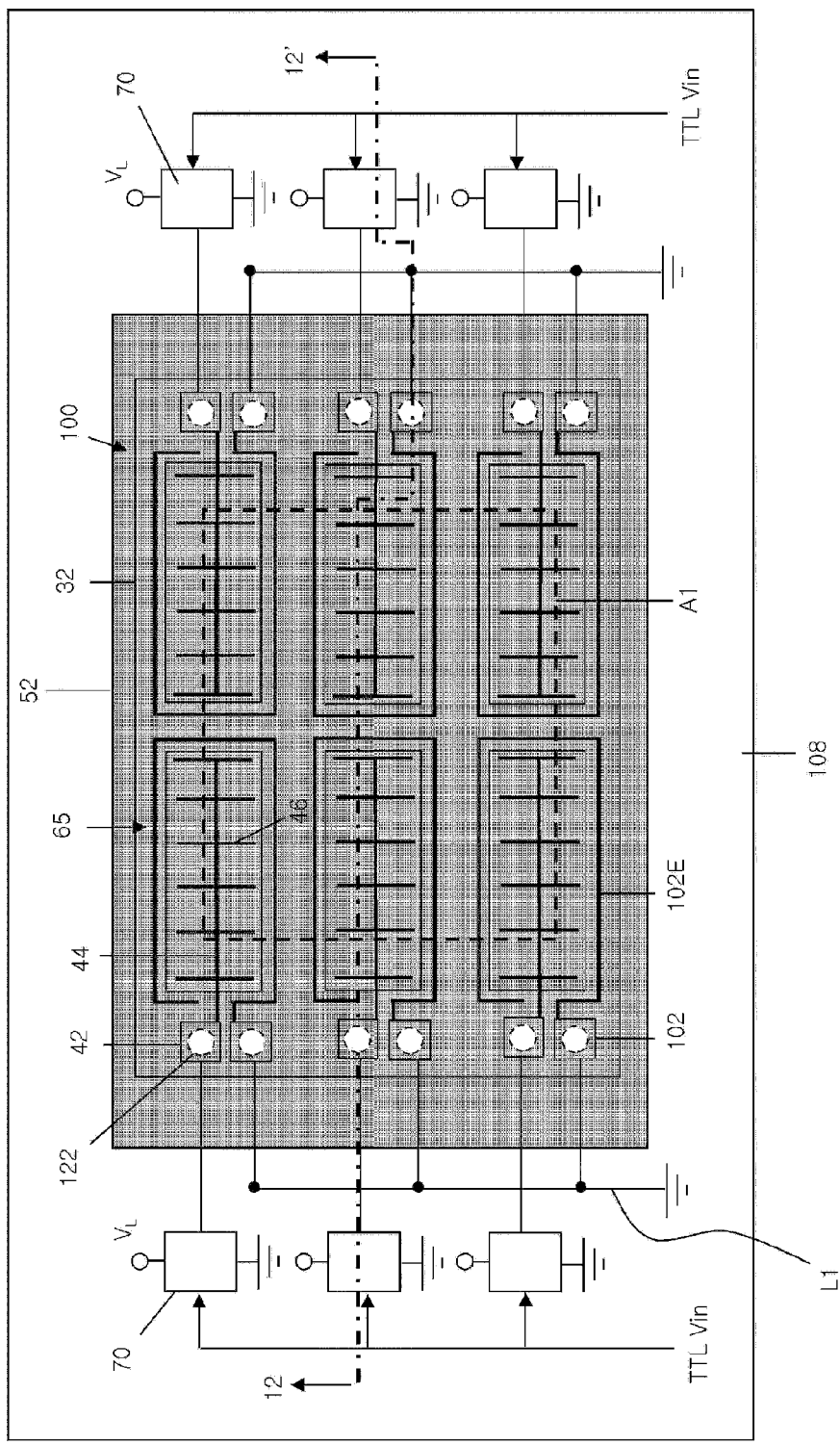
FIG. 11 is a plan view showing a connection between an optical image modulator and a driving device of a PCB according to another exemplary embodiment.

FIG. 11 is a plan view showing a connection between the optical image modulator 65 and the driving device 70 of the PCB 108 according to another exemplary embodiment. A remaining configuration of FIG. 11 except for parts related to the connection between the driving device 70 and each unit optical modulator 65 may be the same as that of FIG. 9.

Referring to FIG. 11, the PCB 108 does not include a bonding pad for connection between the second electrode pad 42 and the driving device 70 and a bonding pad for connection between the ninth electrode pad 102 and the wiring line L1. That is, the driving device 70 and the second electrode pad 42, and the wiring line L1 and the ninth electrode pad 102 are connected to each other via a wiring line without a bonding pad. The transparent substrate 52 covers all components of the large-area optical image modulator 100 and covers a part of the PCB 108 around the optical image modulator 100. In FIG. 11, an area of the transparent substrate 52 is much wider than that of FIG. 9. The transparent substrate 52 may be a glass substrate, a sapphire substrate, a silicon oxide substrate, a silicon carbide (SiC) substrate, or the like.

Figure 12:
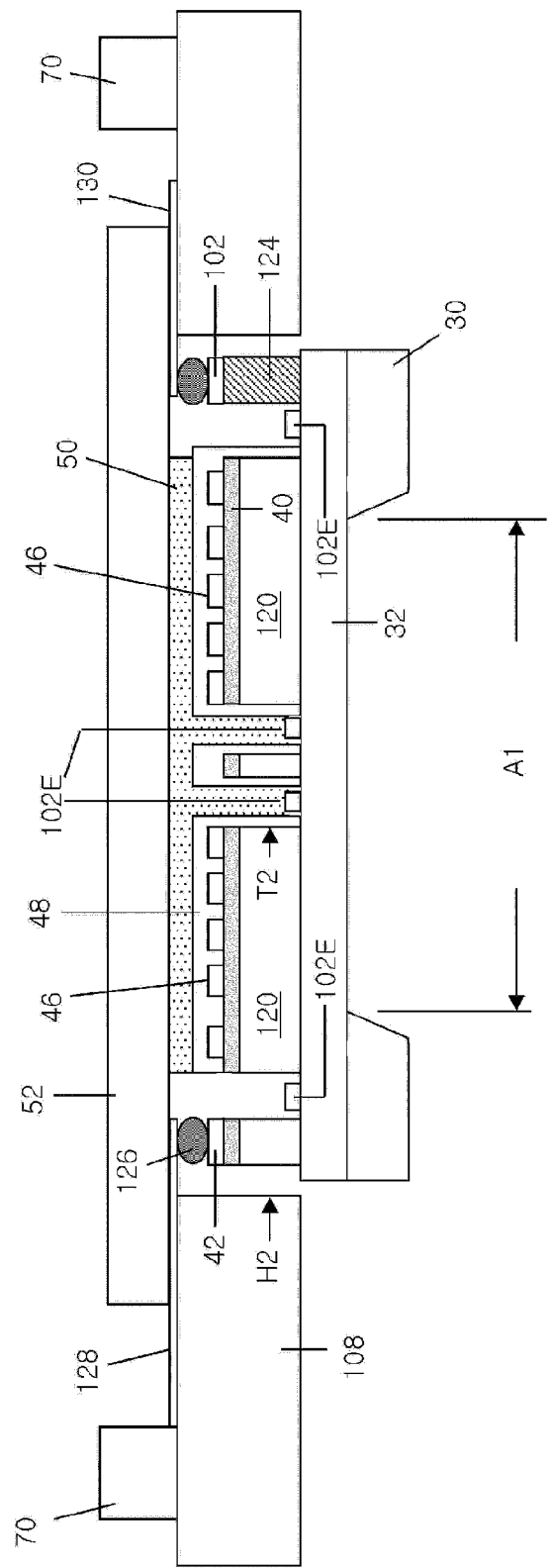
FIG. 12 is a cross-sectional view taken along a line 12-12' of FIG. 11.

FIG. 12 is a cross-sectional view taken along a line 12-12' of FIG. 11.

Referring to FIG. 12, the ninth electrode pad 102 is formed to have the same height as the second electrode pad 42. For this, an insulating layer 124 is formed between the ninth electrode pad 102 and the fast expitaxial layer 32. The ninth electrode 102E may expand along a side surface of the insulating layer 124 to be connected to the ninth electrode pad 102. The insulating layer 124 may be, for example, a benzocyclobutene (BCB) layer. Metal bumps 126 are disposed on the second electrode pad 42 and the ninth electrode pad 102, respectively. The metal bump 126 may be, for example, a solder bump. A third wiring line 128 and a fourth a wiring line 130 are formed on a bottom surface of the transparent substrate 52 around the adherent layer 50. The third and fourth wiring lines 128 and 130 are spaced apart from the adherent layer 50. One end of the third wiring line 128 is connected to the metal bump 126 formed on the second electrode pad 42, and the other end of the third wiring line 128 is connected to the driving device 70 on the PCB 108. One end of the fourth wiring line 130 is connected to the metal bump 126 formed on the ninth electrode pad 102, and the other end of the fourth wiring line 130 is connected to the wiring line L1 on the PCB 108. A through hole H2 in which components of the optical image modulator 100 below the transparent substrate 52 are disposed is formed in the PCB 108. The transparent substrate 52 adheres to an area around the through hole H2 of the PCB 108 and structurally supports the large-area optical image modulator 100. The third and fourth wiring lines 128 and 130 are disposed between the transparent substrate 52 and the PCB 108.

Hereinafter, a method of manufacturing a large-area optical image modulator according to an exemplary embodiment will be described with reference to FIGS. 13 to 19. The description regarding the method of the current embodiment is in relation to a method of manufacturing the optical image modulator taken along a line 2-2' of FIG. 1.

Like reference numerals in the following description denote like elements in the previous description, and thus they will not be repeated here.

Figure 13:
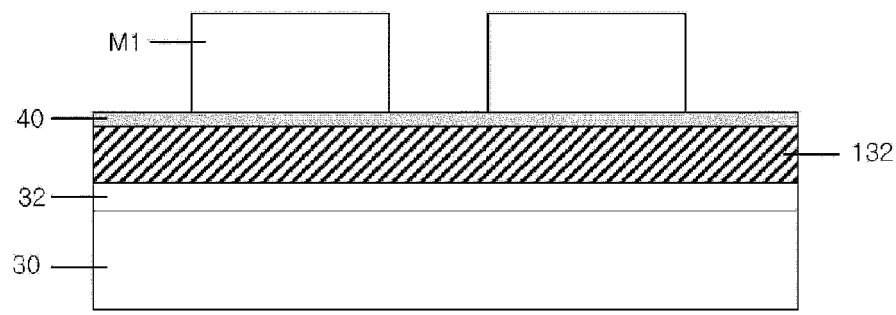
FIGS. 13 to 19 are cross-sectional views showing a method of sequentially manufacturing an optical image modulator according to an exemplary embodiment.

Referring to FIG. 13, the first expitaxial layer 32 is formed on the base substrate 30. The base substrate 30 may be a transparent material layer having a high etch selectivity during sequential dry and wet etching processes and may be, for example, an InGaP layer. The first expitaxial layer 32 may be doped with an n-type impurity, e.g., an Si, or at p-type impurity, e.g., Be, according to usages of the first expitaxial layer 32, and a doping concentration is as described above. The first expitaxial layer 32 may be formed to have a predetermined optical thickness, for example, 4λ, wherein λ denotes a wavelength of incident light. A second expitaxial layer 132 is formed on the first expitaxial layer 32. The second expitaxial layer 132 may be formed by sequentially stacking the first lower DBR layer 34a, the first active layer 36a, and the first upper DBR layer 38a as shown in FIG. 2. The contact layer 40 is formed on the second expitaxial layer 132. The contact layer 40 may be a compound semiconductor layer, for example, a GaAs layer. The contact layer 40 may be doped with a p-type impurity or an n-type impurity according to usages of the contact layer 40. Thus, the contact layer 40 may be a p-type contact layer or an n-type contact layer. A mask M1 for defining an area of a unit optical modulator is formed on the contact layer 40. The mask M1 may be a sensitive film pattern.

Figure 14:
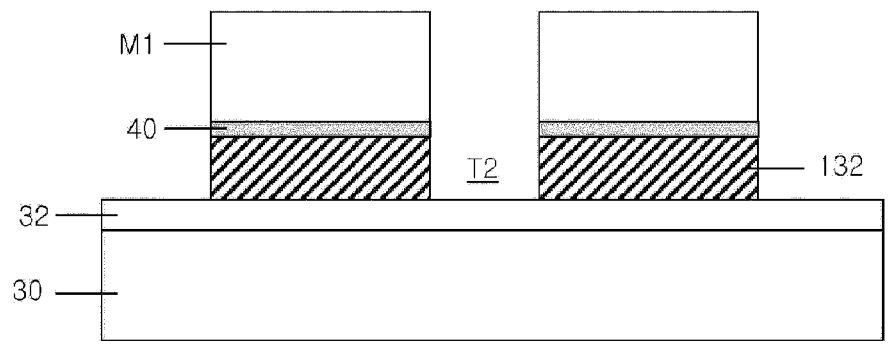

After forming the mask M1, the contact layer 40 and the second expitaxial layer 132 around the mask M1 are sequentially etched. At this time, the etching may be etching using an inductively coupled plasma (ICP) dry etching method. A gas used during the etching may be SiCl4 or Ar. The etching is performed until the first expitaxial layer 32 is exposed. As a result of the etching, as shown in FIG. 14, the divided second expitaxial layers 132 are formed on the first expitaxial layer 32, and the second trench T2 is formed between the divided second expitaxial layers 132. After performing the etching, the mask M1 is removed.

Figure 15:
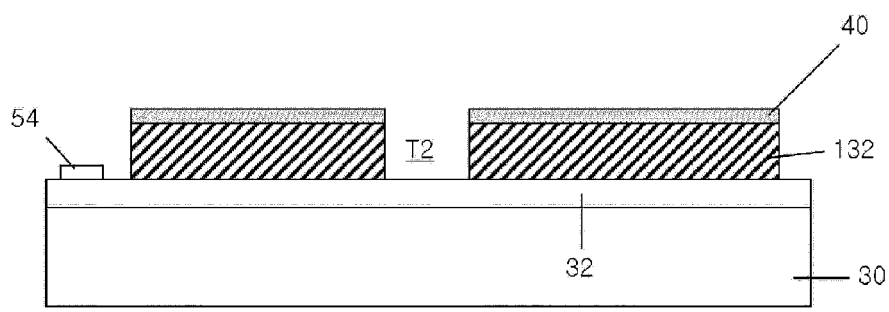

Referring to FIG. 15, the first electrode pad 54 is formed on the first expitaxial layer 32 around the second expitaxial layers 132. The first electrode pad 54 is formed spaced apart from the second expitaxial layers 132. During a process of forming the first electrode pad 54, a first electrode connected to the first electrode pad 54 may be formed on a bottom surface of the second trench T2. At this time, the first electrode is formed spaced apart from the second expitaxial layers 132.

Figure 16:
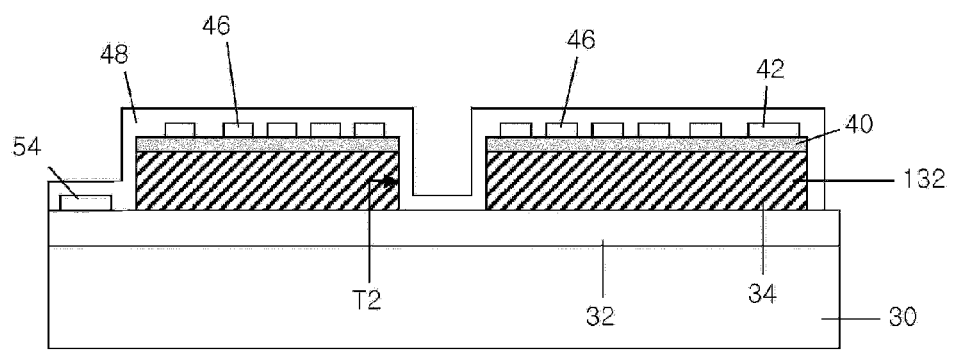
Figure 17:
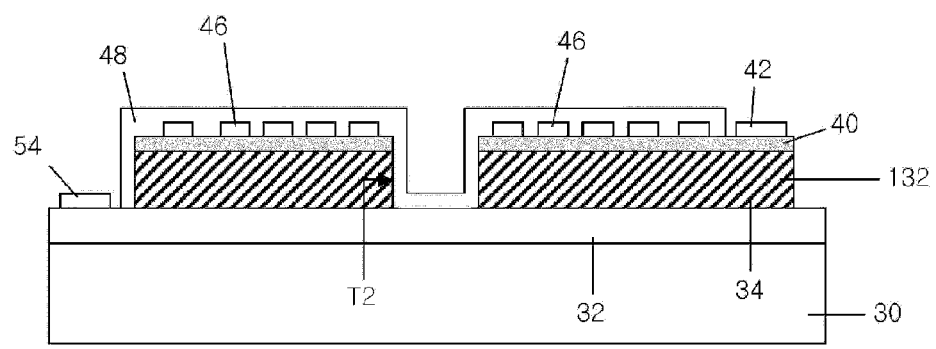
Figure 17:
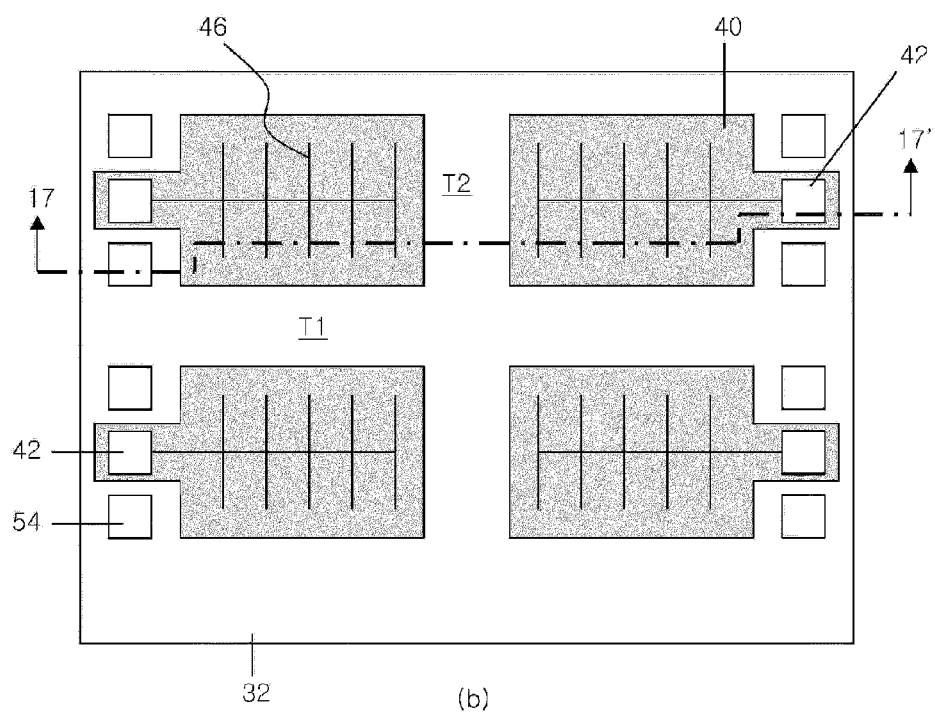

Next, referring to FIG. 16, the second electrode pads 42 and the second electrodes 46 connected to the second electrode pads 42 are formed on the contact layer 40. Then, the insulating layer 48 covering the first and second electrode pads 54 and 42 and the second electrodes 46 is formed on the first expitaxial layer 32. The insulating layer 48 may be a silicon oxide layer or a silicon nitride layer. Then, as shown in FIG. 17, the first and second electrode pads 54 and 42 are exposed by removing parts of the insulating layer 48 covering the first and second electrode pads 54 and 42.

FIG. 17(b) is a plan view of FIG. 17(a), and FIG. 17(a) is a cross-sectional view taken along a line 17-17' of FIG. 17(b). Relationships between FIG. 18(a) and FIG. 18(b) and between FIG. 19(a) and FIG. 19(b) are the same as the relationship between FIG. 17(a) and FIG. 17(b).

Figure 18:
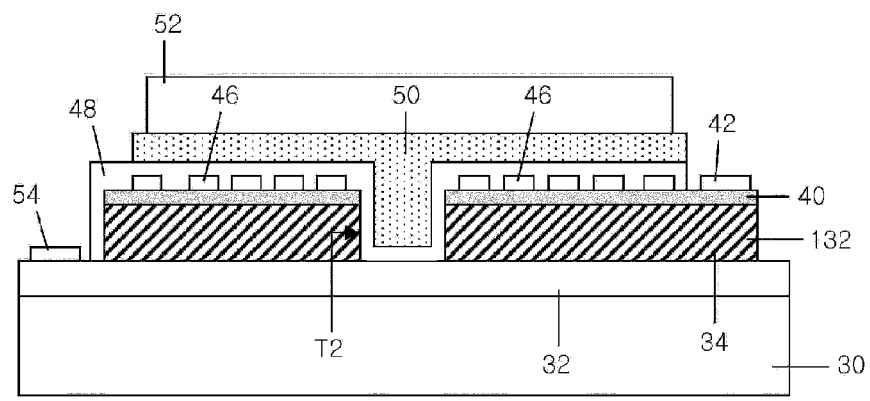
Figure 18:
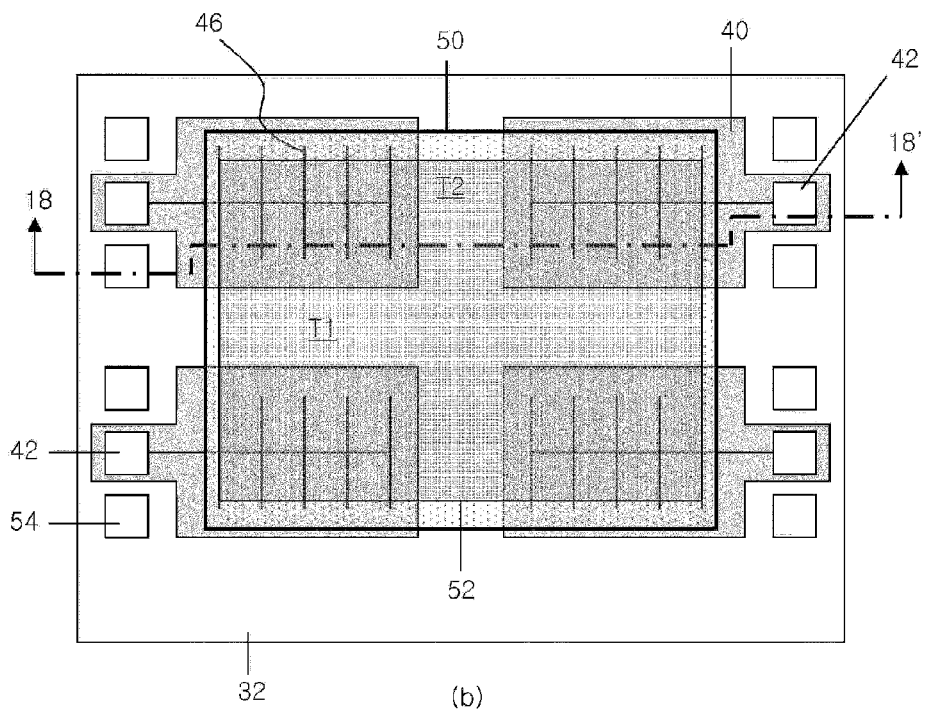

Referring to FIG. 18, the adherent layer 50 filling the second trench T2 is formed on the insulating layer 48 to have a thickness of about 5 to about 10 μm. The adherent layer 50 may be a material layer that is transparent with respect to incident light having a predetermined wavelength, for example, a wavelength of 850 nm, and may withstand up to a predetermined temperature, e.g., 300° C., and the adherent layer 50 may be, for example, an epoxy layer. The transparent substrate 52 is formed on the adherent layer 50. The transparent substrate 52 may have an area that is at least wider than a light-emitting area in consideration of a size of an opened area to be formed in the base substrate 30 in a subsequent process, that is, the light-emitting area.

Figure 19:
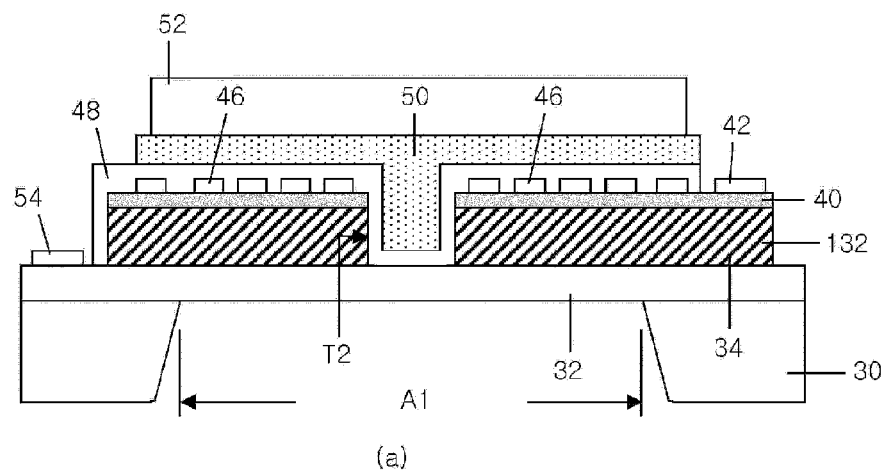
Figure 19:
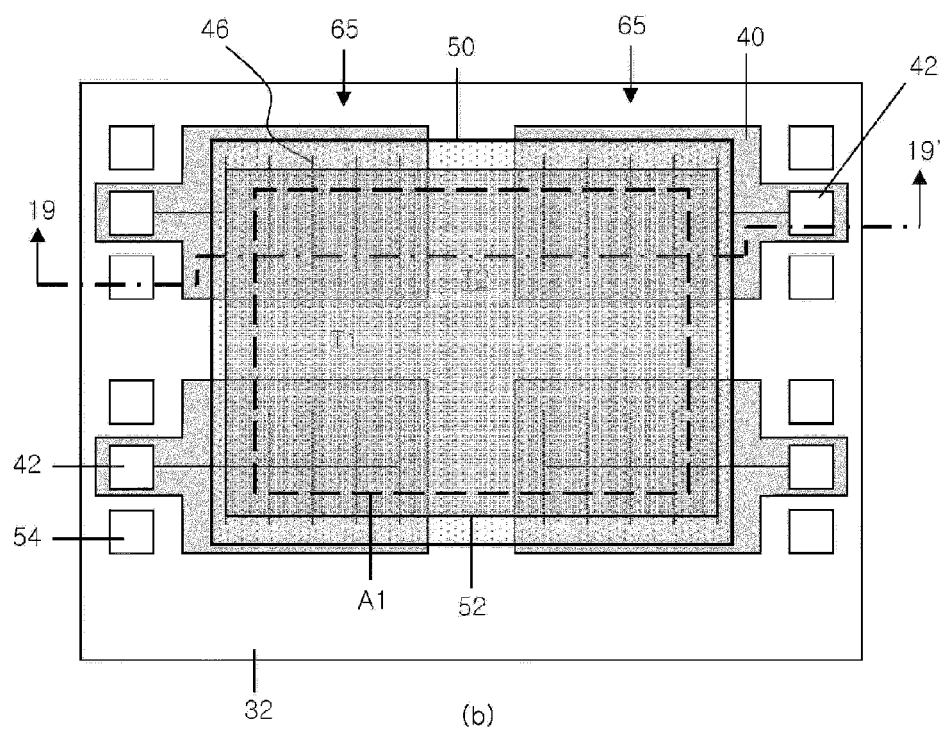

Referring to FIG. 19, after forming the transparent substrate 52, an opened area A1 is formed by removing a part of the base substrate 30. The opened area A1 is a through hole in which a part of a bottom surface of the first expitaxial layer 32 is exposed, and the opened area A1 is also an area in which light incident to the unit optical modulators 65 formed on the first expitaxial layer 32 to be modulated is emitted. A part of the base substrate 30 may be removed by wet etching. At this time, an upper part of the base substrate 30, that is, a stacked structure on the base substrate 30, is mechanically sealed, and only the base substrate 30 becomes a target of the wet etching. After a portion where a through hold of the base substrate 30 is to be formed is defined, the wet etching is performed. The wet etching may use an etchant used to etch, for example, a GaAs substrate. The etchant may be formed by mixing NH4OH, H2O2, and H2O at a ratio of 1:1:5. Such wet etching may be performed until the opened area A1 is formed to a desired size in the base substrate 30. An etch selectivity of the first expitaxial layer 32 with respect to the etchant is as low as about 10,000:1, and thus even though the wet etching is performed until the opened area A1 is formed, the first expitaxial layer 32 is scarcely etched.

Figure 20:
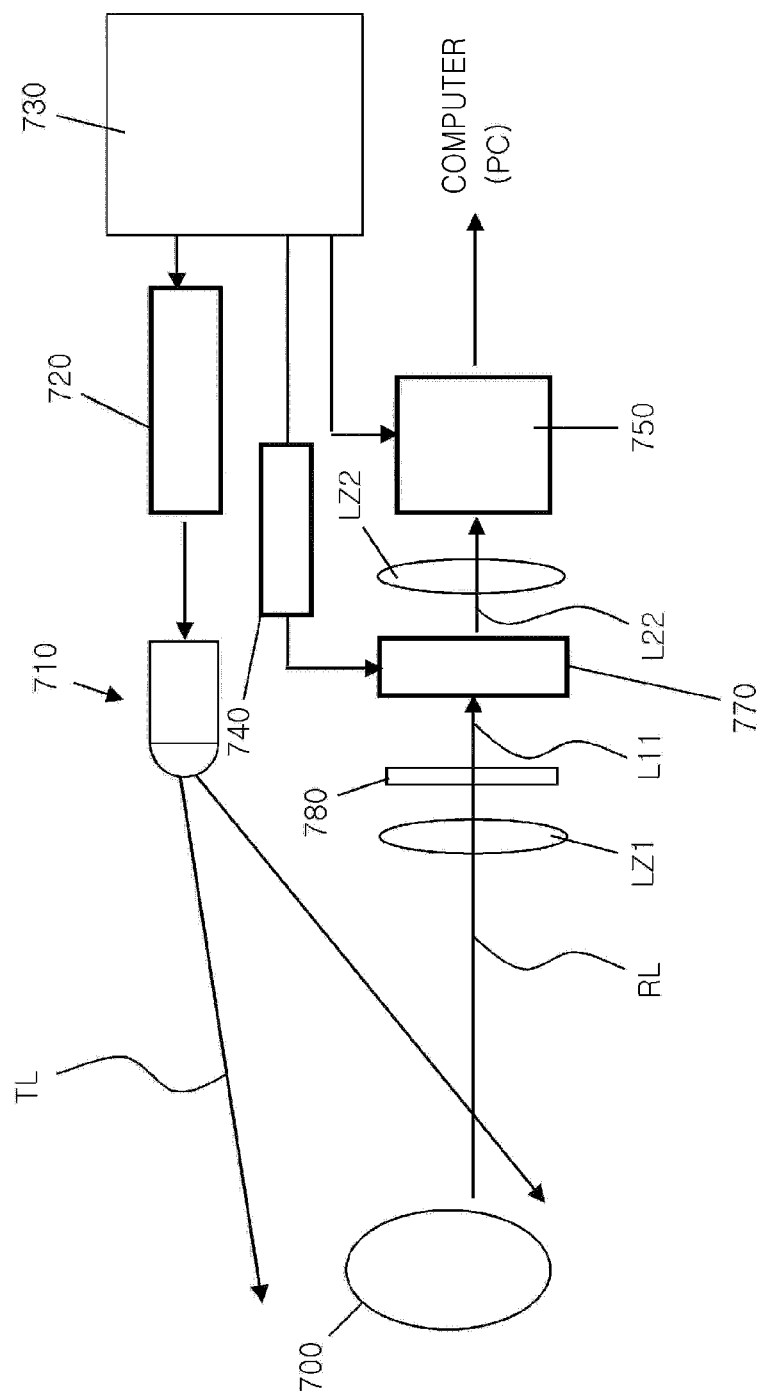
FIG. 20 is a block diagram of an optical apparatus including a transmissive type optical image modulator according to an exemplary embodiment.

FIG. 20 is a block diagram showing a configuration of a system and an operating process of an optical apparatus according to an exemplary embodiment. The optical apparatus of FIG. 20 may be a camera for measuring a distance.

Referring to FIG. 20, the optical apparatus may include a light source 710, a light source driver 720, an optical modulator driver 740, a camera controller 730, an optical image sensor 750, first and second lenses LZ1 and LZ2, a filter 780, and an optical modulator 770. The first lens LZ1, the fitter 780, the optical modulator 770, the second lens LZ2, and the optical image sensor 750 may be arranged in a row and may be disposed on the same optic axis. The light source 710 may be, for example, a light-emitting diode (LED) or a laser diode (LD). An irradiated light TL irradiated onto a subject 700 from the light source 710 is emitted. A this time, the irradiated light TL may be light having a predetermined wavelength, for example, infrared light having a wavelength of 850 nm. The irradiated light TL may be irradiated in the form of a pulse wave or a sine wave. The light source 710 is controlled by the light source driver 720. Operations of the light source driver 720 are controlled by the camera controller 730. Operations of the optical modulator 770 are controlled by the camera controller 730 via the optical modulator driver 740. The camera controller 730 controls operations of the optical modulator driver 740 and the optical image sensor 750. The optical image sensor 750 may be, for example, a charge-coupled device (CCD) or a complementary metal-oxide semiconductor (CMOS). The first lens LZ1 collects reflected light RL reflected by the subject 700, to be adapted so as to be incident to the filter 780. The filter 780 is a band filter for removing spill light except for the irradiated light TL from the reflected light RL, and may be, for example, an infrared (IR) band filter. The second lens LZ2 collects light emitted from the optical modulator 770 in the optical image sensor 750. The optical modulator 770 may be a large-area transmissive type optical image modulator according to the above-described exemplary embodiment.

The optical modulator 770 may be gated by using a logic gating method of turning on/off incident light L11 in response to an electrical gate signal. Also, the optical modulator 770 may gate a gain by using a sine function. The logic gating method enables a distance measurement according to a correlation method. Also, in the case of gating the gain, a phase delay between the irradiated light TL and the incident light L11 may be measured, and thus measuring of a distance by using a phase delay measuring method may be possible.

Light L22 passing through the optical modulator 770 is incident to the optical image sensor 750 via the second lens LZ2. The second lens LZ2 may be selectively disposed. In other words, the second lens LZ2 may be omitted. When the optical image sensor 750 is a CCD, the optical image sensor 750 outputs a brightness image, which is accumulated by integrating an amount of accumulated light gated at high speeds for a predetermined period of time under the control of the camera controller 730, to a computer. Since the distance measurement using the optical modulator 770 may be performed using the CCD and the CMOS that are conventional two-dimensional optical image sensors, there may be an advantage in obtaining a high resolution distance image.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A transmissive type optical image modulator comprising:
    a base substrate;
    a first epitaxial layer formed on the base substrate;
    a plurality of second epitaxial stacks formed on the first epitaxial layer, wherein each of the plurality of second epitaxial stacks is separated from a neighboring one of the plurality of second epitaxial stacks by a trench disposed therebetween;
    a plurality of first electrodes formed on the first epitaxial layer and spaced apart from the plurality of second epitaxial stacks;
    a plurality of second electrodes, each formed on a respective one of the plurality of second epitaxial stacks; and
    a transparent substrate covering the plurality of second epitaxial stacks and the plurality of second electrodes,
    wherein the base substrate comprises a through hole corresponding to a light emitting area, and the first epitaxial layer is a continuous layer which corresponds to the plurality of second epitaxial stacks formed thereon, and
    wherein the first epitaxial layer comprises a top surface exposed by the plurality of second epitaxial stacks.

2. The transmissive type optical image modulator of claim 1, wherein the first epitaxial layer is an etch stop layer with respect to dry etching and wet etching.

3. The transmissive type optical image modulator of claim 2, wherein the first epitaxial layer is an InGaP layer.

4. The transmissive type optical image modulator of claim 1, wherein the first epitaxial layer comprises one of an n-type doping material and a p-type doping material.

5. The transmissive type optical image modulator of claim 1, wherein each of the plurality of second epitaxial stacks comprises a side wall which is substantially perpendicular with respect to the top surface of the first epitaxial layer.

6. The transmissive type optical image modulator of claim 5, wherein the plurality of second epitaxial stacks are disposed in an array and are arranged vertically and bilaterally symmetrical to one another.

7. The transmissive type optical image modulator of claim 1, wherein each of the plurality of second epitaxial stacks comprises a lower distributed Bragg reflector (DBR) layer, an active layer, an upper DBR layer, and a contact layer that are sequentially stacked on the first epitaxial layer in this order.

8. The transmissive type optical image modulator of claim 7, wherein the contact layer is a compound semiconductor layer doped with one of an n-type doping material and a p-type doping material.

9. The transmissive type optical image modulator of claim 7, wherein the plurality of second electrodes are disposed directly on the contact layer, crossing over a center region of a top surface of the contact layer.

10. The transmissive type optical image modulator of claim 1, further comprising a transparent insulating layer on the transparent insulating layer, thereby covering the plurality of second epitaxial stacks and the plurality of second electrodes, wherein the transparent insulating layer covers a side wall and a bottom of the trench.

11. The transmissive type optical image modulator of claim 10, further comprising an adherent layer disposed between the transparent insulating layer and the transparent substrate, thereby completely filling the trench.

12. The transmissive type optical image modulator of claim 1, wherein each of the plurality of first electrodes is an n-type electrode, and each of the plurality of second electrodes is a p-type electrode.

13. The transmissive type optical image modulator of claim 1, wherein each of the plurality of first electrodes surrounds at least one of a part of at least one side of a respective one of the plurality of second epitaxial stacks and at least one entire side of the respective one of the plurality of second epitaxial stacks.

14. The transmissive type optical image modulator of claim 1, wherein each of the plurality of second electrodes has a cross-sectional area having one of a fish bone, a mesh, and a grid.

15. The transmissive type optical image modulator of claim 1, wherein a height of each of the plurality of first electrodes is the same as a height of each of the plurality of second electrodes.

16. The transmissive type optical image modulator of claim 1, wherein the transparent substrate is transparent with respect to incident light having a wavelength of 850 nm.

17. The transmissive type optical image modulator of claim 1, further comprising a light reflection barrier layer coated on the transparent substrate.

18. The transmissive type optical image modulator of claim 1, further comprising a printed circuit board (PCB), wherein:
    the base substrate is mounted on the PCB,
    the PCB comprises a plurality of driving devices, wherein each of the plurality of driving devices is connected to a respective one of the plurality of second electrodes,
    the plurality of first electrodes are grounded through the PCB, and
    the PCB comprises a through hole corresponding to the through hole of the base substrate.

19. The transmissive type optical image modulator of claim 18, wherein the base substrate and the PCB are bonded to each other with a metal paste.

20. The transmissive type optical image modulator of claim 1, further comprising wherein a printed circuit board (PCB) connected to the base substrate, wherein:
    the PCB comprises a plurality of driving devices, wherein each of the plurality of driving devices is connected to a respective one of the plurality of second electrodes,
    the first electrode is grounded through the PCB, and
    the PCB comprises a through hole corresponding to the through hole of the base substrate.

21. The transmissive type optical image modulator of claim 20, further comprising a grounded first wiring line and a second wiring line connected to the driving device disposed on a bottom surface of the transparent substrate, wherein the first and second wiring lines and the first and second electrodes are flip-chip bond to each other.

22. An optical apparatus used to measure a distance, the optical apparatus comprising:
    a light source,
    a light source driver,
    a lens, the transmissive type optical modulator of claim 1,
an optical modulator driver,
an IR band filter, and
an image sensor.

\* \* \* \* \*